(12) United States Patent
Gregoire

(10) Patent No.: US 11,152,259 B2
(45) Date of Patent: Oct. 19, 2021

(54) INTERCONNECTION ELEMENT AND METHOD OF MANUFACTURING THE SAME

(71) Applicant: STMicroelectronics (Crolles 2) SAS, Crolles (FR)

(72) Inventor: Magali Gregoire, Crolles (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 16/881,689

(22) Filed: May 22, 2020

(65) Prior Publication Data

US 2020/0381297 A1 Dec. 3, 2020

(30) Foreign Application Priority Data

May 27, 2019 (FR) ...................................... 1905576

(51) Int. Cl.
| | |
|---|---|
| *H01L 21/768* | (2006.01) |
| *H01L 21/02* | (2006.01) |
| *H01L 21/311* | (2006.01) |
| *H01L 23/522* | (2006.01) |

(Continued)

(52) U.S. Cl.
CPC .... *H01L 21/76858* (2013.01); *H01L 21/0217* (2013.01); *H01L 21/31111* (2013.01); *H01L 21/76802* (2013.01); *H01L 21/76843* (2013.01); *H01L 21/76846* (2013.01); *H01L 21/76877* (2013.01); *H01L 23/528* (2013.01); *H01L 23/5226* (2013.01); *H01L 23/53238* (2013.01)

(58) Field of Classification Search
CPC ......... H01L 21/76858; H01L 23/53238; H01L 21/76834; H01L 21/76831; H01L 21/0217; H01L 21/76843; H01L 21/76846; H01L 21/76849; H01L 21/76877

See application file for complete search history.

(56) References Cited

U.S. PATENT DOCUMENTS

| | | | |
|---|---|---|---|
| 5,308,796 A | 5/1994 | Feldman et al. | |
| 5,391,517 A | 2/1995 | Gelatos et al. | |
| 6,181,013 B1 | 1/2001 | Liu et al. | |

(Continued)

FOREIGN PATENT DOCUMENTS

| | | |
|---|---|---|
| EP | 1351291 A2 | 10/2003 |
| EP | 1990432 A1 | 11/2008 |

OTHER PUBLICATIONS

INPI Search Report and Written Opinion for FR1905576 dated Apr. 21, 2020 (8 pages).

*Primary Examiner* — Bac H Au
(74) *Attorney, Agent, or Firm* — Crowe & Dunlevy

(57) ABSTRACT

An interconnection element of an interconnection structure of an integrated circuit is manufactures by a method where a cavity is etched in an insulating layer. A silicon nitride layer is then deposited on walls and a bottom of the cavity. The nitrogen atom concentration in the silicon nitride layer increasing as a distance from an exposed surface of the silicon nitride layer increases. A copper layer is deposited on the silicon nitride layer. The cavity is further filled with copper. A heating process is performed after the deposition of the copper layer, to convert the copper layer and the silicon nitride layer to form a copper silicide layer which has a nitrogen atom concentration gradient corresponding to the gradient of the silicon nitride layer.

20 Claims, 4 Drawing Sheets

(51) Int. Cl.
*H01L 23/528* (2006.01)
*H01L 23/532* (2006.01)

(56) References Cited

U.S. PATENT DOCUMENTS

| | | |
|---|---|---|
| 6,251,775 B1 | 6/2001 | Armbrust et al. |
| 6,303,505 B1 | 10/2001 | Ngo et al. |
| 6,869,873 B2 | 3/2005 | Bradshaw et al. |
| 9,673,091 B2 * | 6/2017 | Anderson ......... H01L 21/76816 |
| 2002/0155702 A1 * | 10/2002 | Aoki ................. H01L 21/76883 |
| | | 438/653 |
| 2003/0214043 A1 | 11/2003 | Saitoh et al. |
| 2007/0222078 A1 | 9/2007 | Furuya |
| 2013/0207267 A1 * | 8/2013 | Rho .................. H01L 23/53238 |
| | | 257/751 |
| 2014/0339702 A1 | 11/2014 | Woychik et al. |

* cited by examiner

INTERCONNECTION ELEMENT AND METHOD OF MANUFACTURING THE SAME

PRIORITY CLAIM

This application claims the priority benefit of French Application for Patent No. 1905576, filed on May 27, 2019, the content of which is hereby incorporated by reference in its entirety to the maximum extent allowable by law.

TECHNICAL FIELD

The present disclosure generally concerns integrated circuits and, more particularly, interconnection elements of interconnection structures of such integrated circuits.

BACKGROUND

An integrated circuit comprises components formed inside and/or on top of a semiconductor layer. The integrated circuit further comprises an interconnection structure resting on the semiconductor layer. The interconnection structure comprises insulating layers having interconnection elements such as conductive lines or tracks and conductive vias arranged therein. The vias cross one or a plurality of insulating layers of the interconnection structure to electrically couple together conductive tracks and/or components of the circuit and/or conductive pads of the interconnection structure, formed at the level of its upper surface.

There is a need to overcome at least certain disadvantages of known interconnection elements of integrated circuit interconnection structures and of known methods of manufacturing such interconnection elements.

SUMMARY

An embodiment overcomes all or part of the disadvantages of known interconnection elements of integrated circuit interconnection structures.

Another embodiment overcomes all or part of the disadvantages of known interconnection element manufacturing methods.

An embodiment provides a method of manufacturing an interconnection element of an interconnection structure of an integrated circuit, the method comprising the steps of: a) etching a cavity in a first insulating layer; b) depositing a second layer of silicon nitride on the walls and the bottom of the cavity, the nitrogen atom concentration in the second layer increasing as the distance from an exposed surface of the second layer increases; c) depositing a third layer of copper on the second layer; d) heating to form a fourth layer of copper silicide from the second and third layers; and e) filling the cavity with copper.

According to an embodiment, the method further comprises, after step e), the steps of: f) depositing a fifth layer of silicon nitride on the exposed surface of the copper filling the cavity, the nitrogen atom concentration in the fifth layer increasing as the distance from the copper filling the cavity increases; and g) heating to form a sixth layer of copper silicide from the copper filling the cavity and from the fifth layer.

According to an embodiment, step g) is carried out at a temperature in the range from 205 to 245° C. and/or for a time period in the range from 1 to 30 minutes.

According to an embodiment, at step f), the nitrogen atom concentration in the fifth layer is: minimum at the level of a first surface of the fifth layer in contact with the copper and smaller than 30%; and/or maximum at the level of a second surface of the fifth layer opposite to the first surface of the fifth layer, and greater than 50%.

According to an embodiment, the first layer covers a conductive region, preferably of an electronic component of the integrated circuit, and, at step a), the cavity is etched down to the conductive region.

According to an embodiment, step d) is carried out at a temperature in the range from 205 to 245° C. and/or for a time period in the range from 1 to 30 minutes.

According to an embodiment, the nitrogen atom concentration in the second layer is maximum at the level of a first surface of the second layer in contact with the first insulating layer and is greater than 50%; and/or is minimum at the level of a second surface of the second layer opposite to the first surface of the second layer, and is smaller than 30%.

According to an embodiment, the third layer has a thickness in the range from 25 to 150 nm.

According to an embodiment, the second layer has a thickness in the range from 10 to 55 nm.

According to an embodiment, step d) is carried out: after step c) and before step e); or after steps c) and e).

Another embodiment provides an integrated circuit comprising an interconnection structure resting on a semiconductor layer, the interconnection structure comprising an interconnection element at least partly arranged in an insulating layer of said structure, the connection element comprising copper and a copper silicide layer comprising nitrogen atoms, the silicide layer covering a lower surface and a lateral surface of the copper, and the nitrogen atom concentration in the silicide layer increasing as the distance away from the copper increases.

According to an embodiment, the nitrogen atom concentration in the silicide layer is maximum at the level of a surface of the silicide layer opposite to the copper, the maximum nitrogen atom concentration in the silicide layer being in the range from 40 to 60%.

According to an embodiment, the silicide layer further comprises an upper surface of the copper.

According to an embodiment, a lower surface of the interconnection element is in contact with a conductive region, preferably of an electronic component of the integrated circuit.

According to an embodiment, the interconnection element is a conductive line, a conductive via, or a conductive pad.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1:
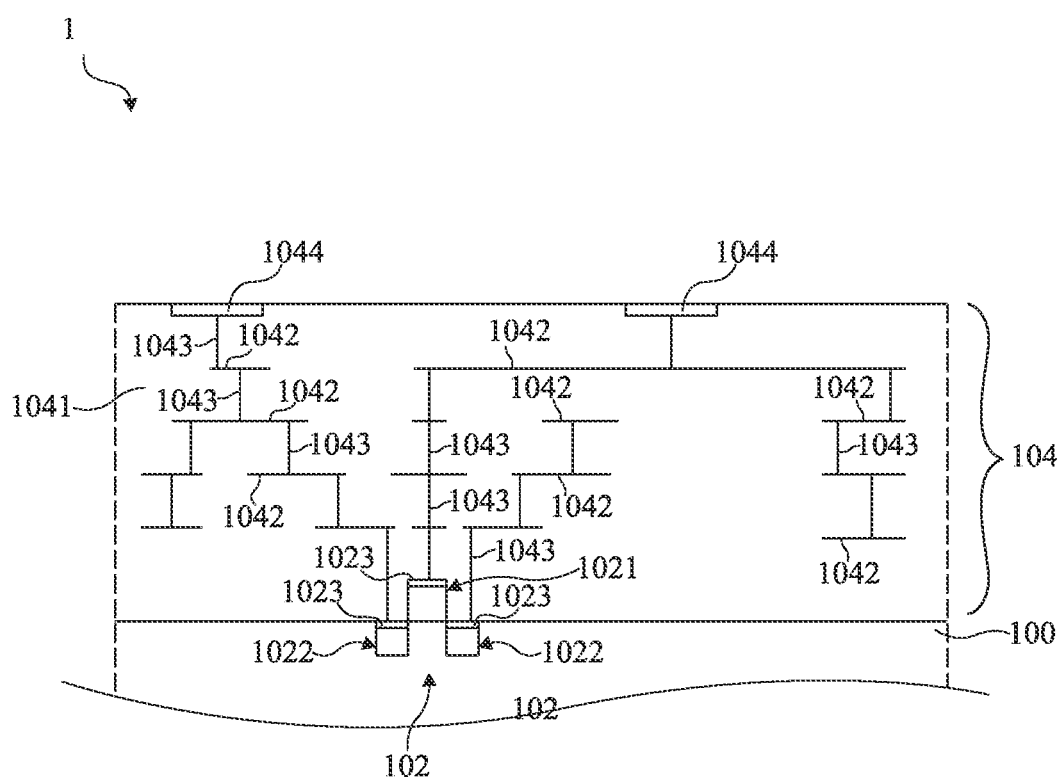
FIG. 1 is a simplified cross-section view of an example of an integrated circuit of the type to which the described embodiments and variations apply.

The same elements have been designated with the same reference numerals in the different drawings. In particular, the structural and/or functional elements common to the different embodiments and variations may be designated with the same reference numerals and may have identical structural, dimensional, and material properties.

For clarity, only those steps and elements which are useful to the understanding of the described embodiments and variations have been shown and are detailed. In particular, certain aspects of steps of the embodiments and variations of the described methods have not been detailed, for example, the etch masks and/or the composition of these masks, these aspects being within the abilities of those skilled in the art.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more other elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "approximately", "substantially", and "in the order of" are used herein to designate a tolerance of plus or minus 10%, preferably of plus or minus 5%, of the value in question.

FIG. 1 is a simplified cross-section view of an example of an integrated circuit 1 of the type to which the embodiments and variations described in relation with FIGS. 2A-2F, 3A-3B, 4A-4B and 5A-5B apply, it being understood that these various embodiments and variations apply to other integrated circuits than that of FIG. 1.

Circuit 1 comprises a plurality of integrated electric circuit components formed inside and/or on top of a semiconductor layer 100. A single component 102, that in the present example is a transistor, is shown in FIG. 1.

Semiconductor layer 100 is, for example, a solid (i.e., bulk) semiconductor substrate or alternatively is a semiconductor layer resting on an insulating layer and forming a semiconductor on insulator (SOI) structure. Layer 100 is made, for example, of germanium, of silicon-germanium or, preferably, of silicon.

Transistor 102 comprises a gate 1021 resting on a channel-forming region, and source and drain regions 1022 separated from each other by the channel-forming region. In this example, gate 1021 and regions 1022 each comprise a silicide 1023 at the level of their upper surfaces.

Circuit 1 comprises an interconnection structure 104. Interconnection structure 104 rests on semiconductor layer 100 and components 102. In other words, interconnection structure 104 covers semiconductor layer 100 and components 102.

Interconnection structure 104 comprises an insulating layer 1041, formed in practice of a stack of insulating layers generally made of different dielectric materials, for example, silicon oxide or silicon nitride.

Interconnection structure 104 further comprises electrically-conductive interconnection elements such as conductive lines or tracks 1042, vias 1043, and contact pads 1044. To avoid overloading FIG. 1, certain conductive vias and certain conductive tracks have been designated with no references.

Vias 1043 extend through insulating layer 1041 to electrically connect conductive lines 1042 to one another, to pads 1044, and/or to components 102, for example, to the conductive regions 1023 of these components. Thus, interconnection structure 104 enables to electrically couple components 102 together and/or to pads 1044. Pads 1044 enable to electrically connect circuit 1 to its outer environment, for example, to a power source.

It should be noted that unlike vias 1043 and lines 1042 which are arranged in insulating layer 1041, that is, preferably totally surrounded by insulating layer 1041 or, in other words, embedded in this layer 1041, pads 1044 are only partially arranged in insulating layer 1041, their upper surfaces being at least partly left exposed.

FIGS. 2A-2F show simplified cross-section views illustrating successive steps of an embodiment of a method of manufacturing an interconnection element of an interconnection structure. Each view illustrates one of these successive steps. As an example, the interconnection element is a metal track, for example, of the type of the tracks 1042 described in relation with FIG. 1.

Figure 2A:
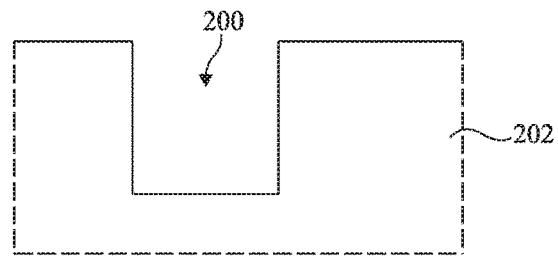
FIGS. 2A-2F show simplified cross-section views illustrating steps of an embodiment of a method of manufacturing an interconnection element of an interconnection structure.

At the step of FIG. 2A, a cavity 200 has been etched in an insulating layer 202. Layer 202 is, for example, formed of a single layer of a single material, for example, silicon nitride or silicon oxide, or of a stack (vertically arranged in FIG. 2A) of a plurality of insulating layers which may be made of different materials, for example, silicon nitride or silicon oxide. Insulating layer 202, for example, corresponds to a portion of the thickness of layer 1041 of interconnection structure 104 (FIG. 1), for example, to an insulating layer of the stack of insulating layers forming insulating layer 1041, for example, to an insulating layer or a stack of insulating layers arranged between components formed inside and/or on top of semiconductor layer 100 and the conductive lines closest to these components (lower metal level).

In this embodiment, the etching is stopped in layer 202. In alternative embodiments, the etching is stopped on a conductive or insulating region or layer having layer 202 resting thereon.

Figure 2B:
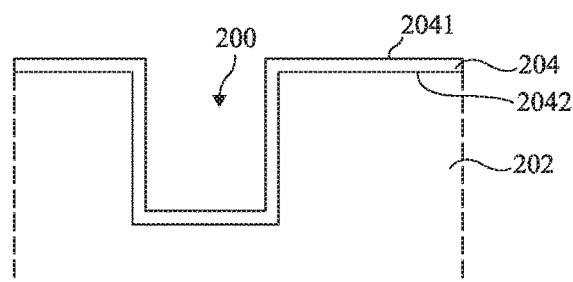

At the step of FIG. 2B, a silicon nitride layer 204 has been deposited, for example, conformally, on the bottom and the lateral walls of cavity 200. Layer 204 totally covers the bottom and the lateral walls of cavity 200. Layer 204 is in contact with insulating layer 202, in this example at the bottom and the lateral walls of cavity 200. Preferably, layer 204 is deposited over the entire structure obtained after the implementation of the step of FIG. 2A, layer 204 and thus also covers the upper surface of insulating layer 202.

The deposition is performed so that the nitrogen atom concentration (N) or atomic nitrogen concentration in layer 204 decreases along its deposition. In other words, the deposition is performed so that the nitrogen atom concentration in the resulting layer 204 exhibits a gradient whereby the nitrogen atom concentration progressively increases as the distance away from the exposed, that is, free or non-covered, surface 2041 of layer 204, increases. Preferably, the nitrogen atom concentration in layer 204 varies between a minimum concentration smaller than or equal to 30% and a maximum concentration greater than 50%, for example, in the order of 65%, or even 80% (and thus, the silicon atom layer concentration (Si) varies between a maximum concentration greater than or equal to 70% and a minimum concentration smaller than 50%, for example, in the order of 35%, or even 20%). Layer 204, for example, has a maximum nitrogen atom concentration (respectively, a minimum silicon atom concentration) at the level of its surface 2042 opposite to its surface 2041 (i.e., maximum at the interface with the insulating layer 202), and a minimum nitrogen atom concentration (respectively, a maximum silicon atom concentration) at the level of its surface 2041.

As an example, the deposition of layer 204 with a nitrogen atom concentration gradient is performed similarly to the known fashion in which titanium nitride (TiN) having a nitrogen atom concentration gradient is deposited, for example, to form a transistor gate.

Still as an example, the deposition of layer 204 is performed in an enclosure or chamber where a silicon target, that is, block or sample, is electrically coupled to two power supply sources, one at least of which is an AC source. A nitrogen flow is supplied to the enclosure. The frequency of the AC source determines the silicon concentration in the deposited silicon nitride, the frequency and the nitrogen flow being modified during the deposition to obtain the nitrogen gradient in layer 204.

As an example, the thickness of layer 204 is in the range from 10 to 55 nm, for example, approximately equal to 20 nm.

Figure 2C:
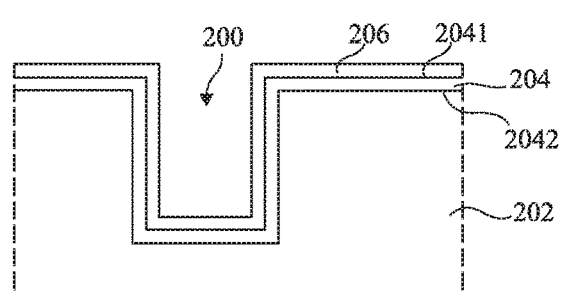

At the step of FIG. 2C, a copper layer 206 has been deposited over the entire exposed surface 2041 of layer 204. Layer 206 is, for example, a thin layer. As an example, the thickness of layer 206 is in the range from 25 to 150 nm. It will be noted that the layer 204 has a minimum nitrogen atom concentration at the level of its surface 2041 adjacent the copper layer 206.

Layer 206 is, for example, deposited by chemical vapor deposition (CVD) or by physical vapor deposition (PVD).

Figure 2D:
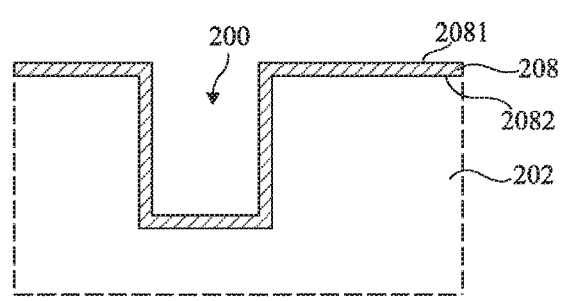

At the step of FIG. 2D, the structure obtained after the implementation of the step of FIG. 2C has been heated to form a copper silicide layer 208 from layers 204 and 206. The obtained silicide layer 208 comprises nitrogen atoms corresponding to the nitrogen atoms which were present in layer 204.

It has been observed that the nitrogen atoms were repelled, on forming of the copper silicide in layer 208, towards surface 2042 of layer 204, surface 2042 being opposite to surface 2041 of this same layer 204 (FIG. 2C). As a result, the nitrogen atom concentration in layer 208 increases as the distance away from its upper (exposed) surface 2081 increases. In particular, the nitrogen atom concentration in layer 208 is maximum at the level of surface 2082 of layer 208, surface 2082 being opposite to surface 2081 of this same layer 208 and being in contact with layer 202. Further, the nitrogen atom concentration in layer 208 is, for example, minimum at the level of its surface 2081. As an example, the maximum nitrogen atom concentration in layer 208, at the level of its surface 2082, is in the range from 40 to 60%, for example, substantially equal to or equal to 50%.

It has further been observed that in the absence of a nitrogen atom concentration gradient in layer 204, silicide layer 208 does not correctly form, particularly if the nitrogen atom concentration is greater than 30% at the level of surface 2041 at the step of FIG. 2B.

It has also been observed that the formed copper silicide is of $Cu_3Si$ type, that is, it comprises 3 copper atoms for one silicon atom. Silicide $Cu_3Si$ has better physical properties than the $Cu_5Si$-type copper silicide comprising 5 copper atoms for one silicon atom. In particular, the $Cu_3Si$ silicide has a better mechanical stability and a smaller resistivity than the $Cu_5Si$ silicide.

As an example, the heating or anneal step is carried out at a temperature in the range from 205 to 245° C. The duration of the anneal step is for example in the range from 1 to 30 minutes.

As an example, this anneal is carried out by means of a heating plate or of an anneal furnace.

Preferably, during the anneal step, all the copper of layer 206 reacts with the silicon of layer 204. Preferably, during the anneal step, all the silicon of layer 204 reacts with the copper of layer 206. Preferably, the entire layer 204 and the entire layer 206 are consumed during the anneal step. It will be within the abilities of those skilled in the art to select the thickness of layers 204 and 206, as well as the gradient or variation of the nitrogen atom concentration in layer 204, to achieve this or these result(s).

Figure 2E:
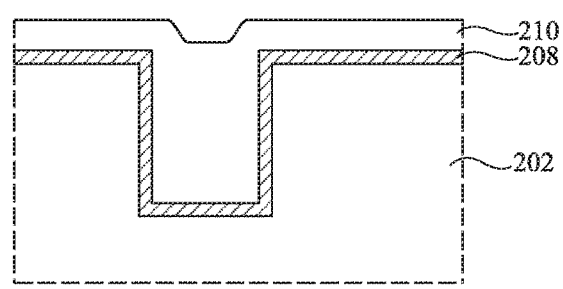

At the step of FIG. 2E, cavity 200 has been filled with copper 210. Copper 210 is, for example, deposited so that the entire upper surface of copper 210 is above the upper level of layer 202.

As an example, copper 210 is deposited in a conformal layer having a thickness in the range from 0.9 to 4 μm, this layer being thick as compared with layer 206. As an example, copper 210 is deposited by electroplating, layer 208 being, for example, used as a cathode during the deposition.

Figure 2F:
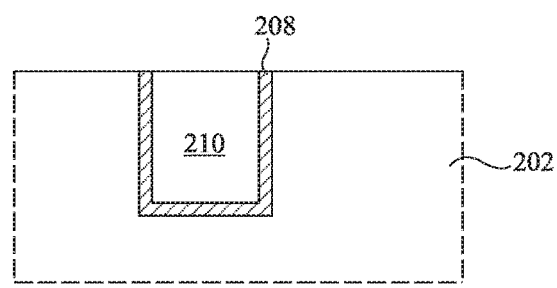

At the step of FIG. 2F, the copper 210 arranged above the upper level of layer 202 has been removed. In other words, the structure obtained after the implementation of the step of view E of FIG. 2 has been planarized, for example, by chemical mechanical polishing/planarization (CMP) down to layer 202.

The copper 210 left in place in cavity 200 and the copper silicide layer 208 covering the lateral surfaces and the lower surface of copper 210 then form an interconnection element of an interconnection structure, for example, a conductive line here seen in a plane transverse to its longitudinal direction.

The following has been observed: if the nitrogen atom concentration at the level of surface 2082 of layer 208 is, for example, smaller than 40%, the effect of segregation of the nitrogen atoms at the level of surface 2042 is too low to prevent copper 210 to diffuse into environment 202, or, in other words, for layer 208 to behave as a diffusion barrier for copper 210.

For next steps, not illustrated, one or a plurality of insulating layers may be deposited over the structure obtained after the implementation of the step of FIG. 2F, such insulating layer(s) for example forming a new insulating layer 202 where the steps described in relation with FIGS. 2A-2F may be repeated, to form other interconnection elements of the interconnection structure.

An advantage of the interconnection element of FIG. 2F is that layer 208 prevents the migration of copper 210 into insulating layer 202.

Another advantage of this interconnection element is that it is less expensive and simpler to produce than an interconnection element where layer 208 would be replaced with one or a plurality of layers comprising a refractory material selected from the group comprising niobium (Nb), molybdenum (Mo), tantalum (Ta), tungsten (W), and rhenium (Re), or even selected from the group comprising niobium (Nb), molybdenum (Mo), tantalum (Ta), tungsten (W), rhenium (Re), titanium (Ti), vanadium (V), chromium (Cr), zirconium (Zr), hafnium (Hf), ruthenium (Ru), rhodium (Rh), osmium (Os), iridium (Ir) and possibly boron (B) and carbon (C). Indeed, the previously-mentioned materials are expensive and/or their deposition methods are complex and expensive to use.

An advantage of the above-described method is that the materials used and the implemented steps are, as such, currently used in conventional integrated circuit manufacturing methods. This particularly enables not to introduce new chemical compounds in a preexisting manufacturing line and thus to decrease the risk of contamination linked to the use of such new compounds.

Further, as compared with the case of an interconnection element where layer 208 would be replaced with at least one layer comprising one of the previously-mentioned refractory materials, it has been observed that the interconnection element described in relation with FIGS. 2A-2F has a better bonding of layers 208 and 210 to each other, and of layer 208 to layer 202. This particularly results from the implemented method which enables to suppress all known heterogeneous interfaces in interconnections including layers of refractory materials.

Further, in the above-described embodiment, the step of FIG. 2D is carried out before the step of FIG. 2E. As a variation, the step of FIG. 2D is carried out after the step of FIG. 2E. In this variation, at the step of FIG. 2E, copper 210 is then deposited on top of and in contact with layer 206 rather than on top of and in contact with layer 208 as described hereabove. In this variation, if copper 210 is deposited by electroplating, layer 206 is, for example, used as a cathode during the deposition.

An advantage of the embodiment described in relation with FIGS. 2A-2F over the above-described alternative embodiment is that the deposition of copper 210 may be performed several hours, or even several days, after the step of view C, due to the fact that layer 208 does not oxidize, or, if it does, oxidizes slower than a copper layer having the same thickness. In the case of the above alternative embodiment, the step of FIG. 2E is preferably performed before layer 206 has a chance to oxidize in order to avoid having to perform an additional step of treatment of the exposed surface of layer 206.

Figure 3A:
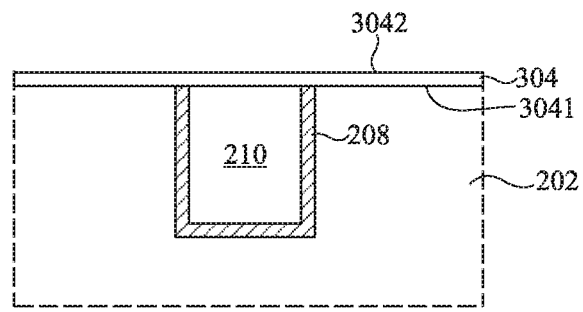
FIGS. 3A-3B show simplified cross-section views illustrating steps of an alternative embodiment of a method of manufacturing an interconnection element of an interconnection structure.
Figure 3B:
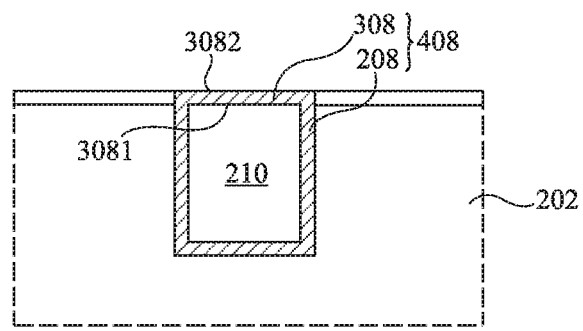

FIGS. 3A-3B show simplified cross-section views illustrating steps of an alternative embodiment of the manufacturing method of FIGS. 2A-2F. In this variation, additional steps are provided to form a copper silicide layer similar to layer 208, over the upper surface of the copper 210 of the structure obtained after the implementation of the step of FIG. 2F.

At the step of FIG. 3A, a silicon nitride layer 304 has been deposited, for example, conformally, on the exposed surface of copper 210 filling cavity 200 (FIG. 2F). Layer 304 totally covers the exposed surface of copper 210. Layer 304 is in contact with the exposed surface of copper 210. Preferably, layer 304 is deposited over the entire structure obtained after the implementation of the step of FIG. 2F, layer 304 then also covering the upper surface of insulating layer 202.

The deposition is performed so that the nitrogen atom (N) concentration in layer 304 increases along its deposition. In other words, the deposition is performed so that the nitrogen atom concentration in layer 304 progressively increases as the distance from copper 210 increases or, in other words, as the distance from surface 3041 of layer 304 which is in contact with copper 210, the top of vertical portions of layer 208, and insulating layer 202, increases. Preferably, the nitrogen atom concentration in layer 304 varies between a maximum concentration greater than 50%, for example in the order of 65%, or even 80%, and a minimum concentration smaller than or equal to 30%, the silicon atom concentration then varying between a minimum concentration smaller than 50%, for example in the order of 35%, or even 20%, and a maximum concentration greater than or equal to 70%. Layer 304 has a maximum nitrogen atom concentration (respectively, a minimum silicon atom concentration) at the level of its surface 3042 opposite to surface 3041, and a minimum nitrogen atom concentration (respectively, a maximum silicon atom concentration) at the level of its surface 3041.

As an example, the deposition of layer 304 with a nitrogen atom concentration gradient is performed similarly to what has been described in relation with view B of FIG. 2, by adapting the nitrogen atom concentration variation in layer 304 with respect to what has been described for layer 204.

As an example, the thickness of layer 304 is in the range from 10 to 55 nm, for example, approximately equal to 20 nm.

At the step of FIG. 3B, the structure obtained after the implementation of the step of FIG. 3A has been heated to form a copper silicide layer 308 from layer 304 and copper 210. Layer 308 then contains nitrogen atoms corresponding to the nitrogen atoms which were present in layer 304. It should be noted that this anneal does not modify the structure and the properties of layer 208.

It has been observed that the nitrogen atoms were repelled, during the forming of the copper silicide of layer 308, towards the upper or exposed surface 3042 of layer 304. As a result, vertically in line with copper 210, the nitrogen atom concentration in layer 308 increases as the distance from copper 210 increases, that is, as the distance from lower surface 3081 of layer 308 which is in contact with copper 210 increases. In particular, the nitrogen atom concentration in layer 308 is maximum at the level of surface 3082 of layer 308, surface 3082 being opposite to surface 3081 in contact with copper 210. Further, the nitrogen atom concentration in layer 308 is, for example, minimum at the level of its surface 3081 in contact with copper 210. As an example, the maximum nitrogen atom concentration in layer 308, at the level of its surface 3082, is in the range from 40 to 60%, for example, substantially equal or equal to 50%.

It has further be observed that in the absence of a nitrogen atom concentration gradient in layer 304, silicide layer 308 does not form correctly, particularly if the nitrogen atom concentration is greater than 30% at the level of surface 3041 at the step of view A of FIG. 3.

It has also been observed that the formed copper silicide is of $Cu_3Si$ type.

As an example, the heating or anneal step is carried out at a temperature in the range from 205 to 245° C. The duration of the anneal step is, for example, in the range from 1 to 30 minutes.

As an example, the anneal is carried out by means of a heating plate or of an anneal furnace.

Preferably, during the anneal step, all the silicon of layer 304 reacts with copper 210. Preferably, the entire layer 304 is consumed during the anneal step. It will be within the abilities of those skilled in the art to select the thickness of layer 304, as well as the nitrogen atom concentration gradient or variation in layer 304, to achieve this result.

An interconnection element comprising copper 210 having its lower and upper and lateral surfaces coated with a layer 408 formed of layers 208 and 308 is thus obtained, while the interconnection element obtained after the implementation of the step of view F of FIG. 2 comprises copper having only its lateral and lower surfaces coated with copper silicide layer 208. Layer 408, like layer 208, comprises nitrogen atoms having a concentration which increases as the distance from copper 210 increases, the nitrogen atom concentration in layer 408 being, for example, maximum on the side of layer 408 opposite to copper 210 and being, for example, in the range from 40 to 60%, for example, substantially equal or equal to 50%. It has been observed that, if the nitrogen atom concentration in layer 308 is, for example, smaller than 40% at the level of surface 3082, the nitrogen atom segregation effect at the level of surface 3082 is too low to guarantee the electric insulation of copper 210 with respect to a material which would be deposited on layer 308.

Layer 408 benefits from the advantages and from the properties of layer 208 which have been described in relation with FIGS. 2A-2F. Further, the advantages of the methods described in relation with FIGS. 2A-2F also apply to the case where the method comprises the additional steps described in relation with FIGS. 3A-3B.

A specific advantage of the interconnection element of FIG. 3B is that it is less sensitive to oxidation, when the structure of FIG. 3B is left as such, than the interconnection element of FIG. 2F when the structure of FIG. 2F is left as such. This is particularly advantageous when the interconnection element is a contact pad such as the contact pads 1044 described in relation with FIG. 1.

For next steps, not illustrated, one or a plurality of insulating layers may be deposited over the structure obtained after the implementation of the steps of FIGS. 2A-2F and 3A-3B, such insulating layer(s) for example forming a new insulating layer 202 where the steps described in relation with FIGS. 2A-2F and 3A-3B may be repeated, to form other interconnection elements of the interconnection structure.

Although this has not been claimed herein, it could have been provided to form layer 308 for an interconnection element comprising copper 210 but where layer 208 is replaced with at least one layer comprising a refractory material such as those listed in relation with FIGS. 2A-2F.

Figure 4A:
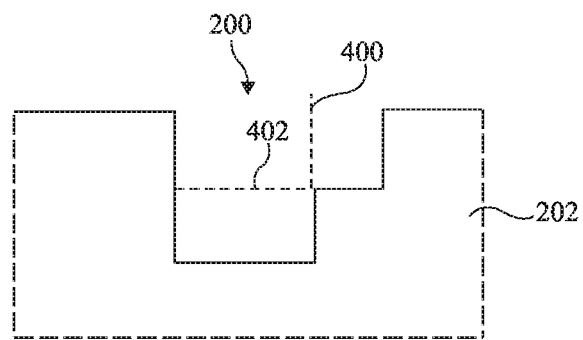
FIGS. 4A-4B show simplified cross-section views illustrating an alternative embodiment of steps of the method of FIGS. 2A-2F.
Figure 4B:
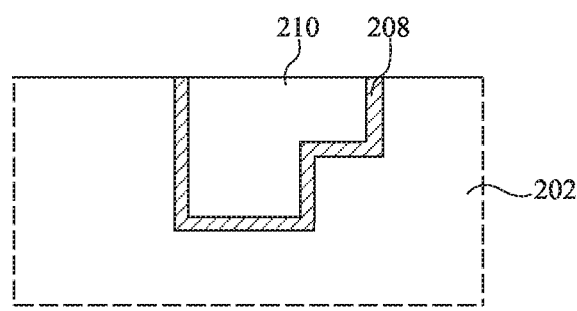

FIGS. 4A-4B show simplified cross-section views illustrating an alternative embodiment of steps of the method of FIGS. 2A-2F.

FIG. 4A illustrates an alternative embodiment of the step described in relation with FIG. 2A.

At the step of FIG. 4A, cavity 200 has been formed by two successive etch steps, each carried out with a different mask. Thus, in this variation, the lateral walls of cavity 200 are not vertical along the entire depth of cavity 200, conversely to what has been shown in FIG. 2A when cavity 200 is etched by using a single etch mask.

As an example, the cavity 200 shown in FIG. 4A is obtained by etching a first cavity 400 (in dotted lines in view FIG. 4A) with a first mask comprising a first opening (not shown), and then by etching a second cavity 402 (in dotted lines in FIG. 4), shallower than cavity 400, with a second mask comprising a second opening larger than the first opening. Together, cavities 400 and 402 form cavity 200. The order in which cavities 400 and 402 are etched may be inverted.

FIG. 4B shows the interconnection element obtained by then implementing the steps of FIGS. 2B, 2C, 2D, 2E, and 2F. As described in relation with FIGS. 2A-2F, the steps of FIGS. 2C, 2D, and 2E may be carried out one after the other, in this order, or the step of FIG. 2D may be carried out after the steps of FIGS. 2C and 2E.

Further, the steps of FIGS. 3A and 3B may be implemented from the structure illustrated in FIG. 4B.

Figure 5A:
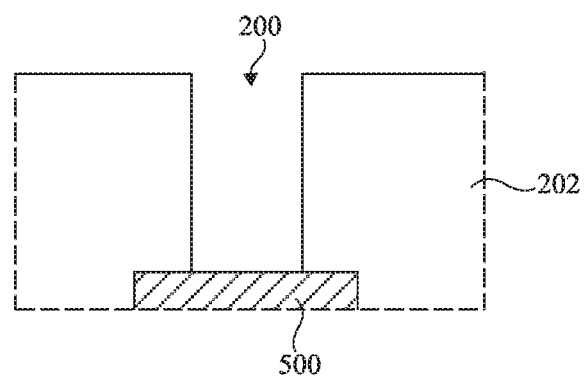
FIGS. 5A-5B show simplified cross-section views illustrating another alternative embodiment of steps of the method of FIGS. 2A-2B.
Figure 5B:
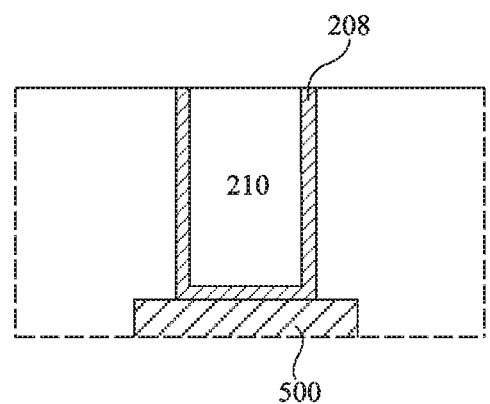

FIGS. 5A-5B show simplified cross-section views illustrating an alternative embodiment of steps of the method of FIGS. 2A-2F.

FIG. 5A illustrates an alternative embodiment of the step described in relation with FIG. 2A.

In this variation, layer 202 covers a region or a layer 500, in this example formed of an electrically-conductive material.

As an example, region 500 corresponds to a silicided region 1023 described in relation with FIG. 1, for example, a silicided region 1023 formed from the reaction between silicon of semiconductor layer 100 and a metal deposition of nickel (Ni), cobalt (Co), titanium (Ti), or any other metal known to form a silicide. The interconnection element formed during the implementation of the variation of FIGS. 5A-5B is then preferably a conductive via, for example, a conductive via 1043 (FIG. 1) having its lower end in contact with region 500 (or 1023) of a component 102 of the integrated circuit and having its upper end in contact with a conductive track 1042 of interconnection structure 104. Such a conductive via 1043, in contact with a conductive region of a component formed inside and/or on top of a semiconductor wafer, is called contact.

Still as an example, region 500 corresponds to an interconnection element, for example, a conductive track or a conductive via such as those described in relation with FIG. 1.

At the step of FIG. 5A, cavity 200 is etched down to region 500. Thus, the bottom of cavity 200 corresponds to a portion of the upper surface of region 500.

FIG. 5B shows the interconnection element obtained by then implementing the steps of FIGS. 2B, 2C, 2D, 2E, and 2F. As described in relation with FIGS. 2A-2F, the steps of FIGS. 2C, 2D, and 2E may be carried out one after the other, in this order, or the step of FIG. 2D may be carried out after the steps of FIGS. 2C and 2E.

The interconnection element thus obtained is in contact, at the level of its lower surface, and more particularly at the level of the lower surface of layer 208, with region 500. Due to the fact that layer 208 is electrically conductive, the interconnection element comprising copper 210 and layer 208 is electrically connected to region 500.

Although this is not illustrated herein, the steps of FIGS. 3A and 3B may be implemented from the structure illustrated by FIG. 5B.

Although this has not been detailed, in each interconnection element described hereabove in relation with FIGS. 2A-2F, 3A-3B, 4A-4B, and 5A-5B, the lateral, lower, and, possibly, upper surfaces of copper 210 are only separated from the medium surrounding the interconnection element (layer 202, region 500 if present, and possibly another interconnection element formed above this interconnection element) by layer 208 or layer 408, according to cases. In other words, layers 208, 308, and 408 are in contact with copper 210 at the level of their surfaces arranged on the side of the copper. Layers 208, 308, and 408 are in contact with the medium surrounding the connection element at the level of their surfaces arranged on the side opposite to copper 210. For example, layers 208 and 408 are in contact with insulating layer 1041 of interconnection structure 104.

Embodiments and variations of an interconnection element of an integrated circuit interconnection structure and embodiments and variations of methods of manufacturing such an interconnection element have been described in relation with FIGS. 2A-2F, 3A-3B, 4A-4B, and 5A-5B. Such embodiments and variations apply to other integrated circuits than that described, as an example, in relation with FIG. 1.

Further, although embodiments and variations of methods of manufacturing a single interconnection elements have been described hereabove, in practice, a plurality of integrated circuits, preferably identical, are manufactured simultaneously, from a same solid semiconductor or SOI-type wafer or plate. It can then be understood that the described steps are simultaneously implemented for the circuits of this wafer. In particular, the layers depositions are preferably performed full plate, that is, the deposited layers are deposited over the entire exposed surface of the plate.

Further, in an integrated circuit interconnection structure, a plurality of interconnection elements may be simultaneously formed. For example, in interconnection structure 104, it is provided for all the conductive lines 1042, respectively, vias 1043, respectively, pads 1044, located at a same level to be formed simultaneously. It can then be understood that the described steps are carried out simultaneously for the simultaneously-formed interconnection elements.

Various embodiments and variations have been described. It will be understood by those skilled in the art that certain features of these various embodiments and variations may be combined, and other variations will occur to those skilled in the art. In particular, the alternative embodiments described in relation with FIGS. 3A-3B, 4A-4B, and 5A-5B may be combined, either two by two, or all together.

Finally, the practical implementation of the described embodiments and variations is within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A method of manufacturing an interconnection element of an interconnection structure of an integrated circuit, the method comprising:
   a) etching a cavity in a first insulating layer;
   b) depositing a silicon nitride layer on walls and a bottom of the cavity, wherein a nitrogen atom concentration in the silicon nitride layer increases as distance from an exposed surface of the silicon nitride layer increases;
   c) depositing a copper layer on the exposed surface of the silicon nitride layer;
   d) heating to convert the silicon nitride layer and the copper layer to form a copper silicide layer which lines the walls and bottom of the cavity; and
   e) filling the cavity with copper.

2. The method of claim 1, further comprising, after e) filling:
   f) depositing a further silicon nitride layer on an exposed surface of the copper filling the cavity, wherein a nitrogen atom concentration in the further silicon nitride layer decreases as distance from an exposed surface of the further silicon nitride layer increases; and
   g) heating to convert the further silicon nitride layer and a portion of the copper filling the cavity to form a further copper silicide layer.

3. The method of claim 2, wherein g) heating is carried out:
   at a temperature in a range from 205 to 245° C.; and
   for a time period in a range from 1 to 30 minutes.

4. The method of claim 2, wherein, at f) depositing, the nitrogen atom concentration in the further silicon nitride layer is:
   minimum at a level of a first surface of the further silicon nitride layer in contact with the copper fill and smaller than 30%; and
   maximum at a level of a second surface of the further silicon nitride layer opposite to the first surface of the further silicon nitride layer and greater than 50%.

5. The method of claim 1, wherein the first insulating layer covers a conductive region and, at a) etching, the cavity is etched down to the conductive region.

6. The method of claim 5, wherein the conductive region is associated with an electronic component of the integrated circuit.

7. The method of claim 1, wherein d) heating is carried out:
   at a temperature in a range from 205 to 245° C.; and
   for a time period in a range from 1 to 30 minutes.

8. The method of claim 1, wherein, at b) depositing, the nitrogen atom concentration in the silicon nitride layer is:
   maximum at a level of a first surface of the silicon nitride layer in contact with the first insulating layer and greater than 50%; and
   minimum at a level of a second surface of the silicon nitride layer opposite to the first surface of the silicon nitride layer and smaller than 30%.

9. The method of claim 1, wherein the copper layer has a thickness in a range from 25 to 150 nm.

10. The method of claim 1, wherein the silicon nitride layer has a thickness in a range from 10 to 55 nm.

11. The method of claim 1, wherein d) heating is carried out after c) depositing and before e) filing.

12. The method of claim 1, wherein d) heating is carried out after c) depositing and after e) filling.

13. The method of claim 1, wherein the interconnection element is selected from a group consisting of: a conductive line, a conductive via, and a conductive pad.

14. A method of manufacturing an interconnection element of an interconnection structure of an integrated circuit, the method comprising:
   a) etching a cavity in a first insulating layer;
   b) depositing a first layer made of silicon nitride on walls and a bottom of the cavity, wherein a thickness of said first layer has a nitrogen atom concentration gradient;
   c) depositing a second layer made of copper on the first layer;
   d) heating to convert the first and second layers to form a copper silicide layer which lines the walls and bottom of the cavity; and
   e) filling the cavity with a conductive material in contact with the copper silicide layer.

15. The method of claim 14, further comprising, after e) filling:
   f) depositing a third layer made of silicon nitride layer on an exposed surface of the conductive material filling the cavity, wherein a thickness of said third layer has a nitrogen atom concentration gradient; and
   g) heating to convert the third layer and a portion of the conductive material filling the cavity to form a further silicide layer.

16. The method of claim 15, wherein nitrogen atom concentration for the nitrogen atom concentration gradient of the third layer is:
   minimum at a level of a first surface in contact with the conductive material filling the cavity; and maximum at a level of a second surface opposite to the first surface.

17. The method of claim 14, wherein nitrogen atom concentration for the nitrogen atom concentration gradient of the first layer is:

maximum at a level of a first surface in contact with the first insulating layer; and minimum at a level of a second surface opposite to the first surface.

18. The method of claim 14, wherein d) heating is carried out after c) depositing and before e) filing.

19. The method of claim 14, wherein d) heating is carried out after c) depositing and after e) filling.

20. The method of claim 14, wherein the interconnection element is selected from a group consisting of: a conductive line, a conductive via, and a conductive pad.

* * * * *